United States Patent
Rois et al.

(10) Patent No.: US 9,167,340 B2
(45) Date of Patent: Oct. 20, 2015

(54) APPARATUS AND METHODS FOR LIMITING SOUND VOLUME

(71) Applicant: Direct Sound Headphones, LLC, St. Louis, MO (US)

(72) Inventors: Brian Anthony Rois, St. Louis, MO (US); Stephen John Rois, Webster Groves, MO (US); Johnny Joseph Gresko, Arnold, MO (US)

(73) Assignee: DIRECT SOUND HEADPHONES, LLC, St. Louis, MO (US)

( * ) Notice: Subject to any disclaimer, the term of this patent is extended or adjusted under 35 U.S.C. 154(b) by 407 days.

(21) Appl. No.: 13/651,916

(22) Filed: Oct. 15, 2012

(65) Prior Publication Data

US 2014/0105414 A1    Apr. 17, 2014

(51) Int. Cl.
  *H04R 1/10*    (2006.01)
  *H03G 11/04*   (2006.01)
  *H04R 3/00*    (2006.01)

(52) U.S. Cl.
  CPC ............ *H04R 1/1091* (2013.01); *H03G 11/04* (2013.01); *H04R 1/1008* (2013.01); *H04R 3/007* (2013.01); *H04R 2430/01* (2013.01)

(58) Field of Classification Search
  CPC .............. H04R 1/1091; H04R 1/1008; H04R 2430/01; H04R 3/007; H03G 11/04
  See application file for complete search history.

(56) References Cited

U.S. PATENT DOCUMENTS

| | | | |
|---|---|---|---|
| 4,167,681 A * | 9/1979 | Wolkstein et al. | ............ 327/318 |
| 4,224,470 A | 9/1980 | Persson et al. | |
| 5,448,646 A | 9/1995 | Lucey et al. | |
| 7,231,037 B2 | 6/2007 | Hansen et al. | |
| 7,853,034 B1 | 12/2010 | Gresko | |
| D648,706 S | 11/2011 | Gresko et al. | |
| D649,956 S | 12/2011 | Gresko et al. | |
| D651,764 S | 1/2012 | Gresko et al. | |
| 2007/0230715 A1 | 10/2007 | Ingemi et al. | |
| 2011/0038491 A1 | 2/2011 | Barr et al. | |
| 2011/0200203 A1 | 8/2011 | Chu | |

FOREIGN PATENT DOCUMENTS

WO   2010/112859   10/2010

OTHER PUBLICATIONS http://www.bose.com/controller?url=/shop_online/headphones/noise_cancelling_headphones/index.jsp.
http://beatsbydre.com/, dated Jul. 11, 2012.

* cited by examiner

*Primary Examiner* — Tuan D Nguyen
(74) *Attorney, Agent, or Firm* — Harness, Dickey & Pierce, P.L.C.

(57) ABSTRACT

Exemplary embodiments or implementations are disclosed of methods, apparatus, and systems for a volume limiter circuit. A rectifier sub-circuit is configured to rectify at least a portion of an audio signal received from an audio source. A junction field effect transistor (JFET) has a channel connected in series between the audio source and a speaker. A feedback sub-circuit is configured to provide a gate signal at a gate of the JFET and to modulate a control signal in accordance with the audio signal crossing the JFET channel. The feedback sub-circuit is connected with the rectifier sub-circuit so as to extend a range of variable resistance of the JFET channel. The limiter circuit provides functionality that changes in response to varying audio voltages.

8 Claims, 9 Drawing Sheets

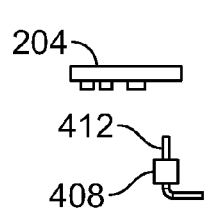
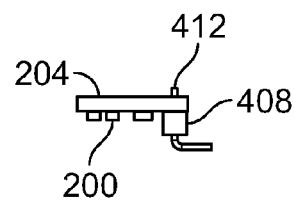
FIG. 10A        FIG. 10B
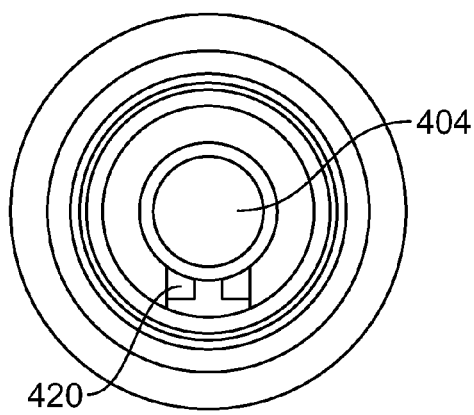
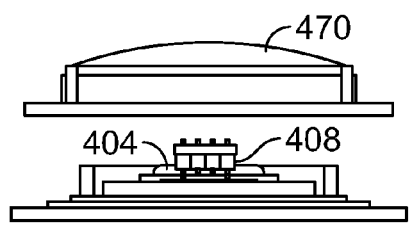
FIG. 10C        FIG. 10D

APPARATUS AND METHODS FOR LIMITING SOUND VOLUME

FIELD

The present disclosure relates to apparatus and methods for limiting sound volume in headphones.

BACKGROUND

This section provides background information related to the present disclosure which is not necessarily prior art.

In today's world, music is everywhere. It is in people's homes, cars, stores, workplaces and now even in people's pockets. Personal Music Players (PMPs) have become a staple of the world's technological diet. PMPs are a technical marvel that allow one to take along an entire music collection and listen to any song at will, all on a device the size of a credit card or smaller.

Loud stereo systems and devices that power headphones, however, can cause hearing loss. In the case of headphones and ear buds, the sound directly interacts with the human ear, and because headphone and ear bud users are not disturbing anyone with their music, users can turn up the volume louder than they otherwise could, simply due to the isolated environment.

SUMMARY

This section provides a general summary of the disclosure, and is not a comprehensive disclosure of its full scope or all of its features.

In one example embodiment, the disclosure is directed to a volume limiter circuit. The circuit includes a rectifier sub-circuit configured to rectify at least a portion of an audio signal received from an audio source and to provide a control signal. A junction field effect transistor (JFET) has a channel connected in series between the audio source and a speaker. A feedback sub-circuit is configured to provide a gate signal at a gate of the JFET and to modulate the control signal in accordance with the audio signal crossing the JFET channel. The feedback sub-circuit is connected with the rectifier sub-circuit so as to extend a range of variable resistance of the JFET channel.

In another example embodiment, the disclosure is directed to a headset including an audio input and a speaker. A limiter circuit is connected between the audio input and the speaker. The limiter circuit is configured to, when neither a rectifier sub-circuit nor a limiting sub-circuit of the limiter circuit are active, reduce voltage at the speaker using substantially only a series resistance. The limiter circuit is further configured to perform as follows: when the rectifier sub-circuit has become activated, the limiter circuit applies a negative voltage to a JFET gate through a feedback sub-circuit, and when the limiting sub-circuit has become activated, the limiter circuit reduces voltage at the speaker through the limiting sub-circuit.

In yet another embodiment, the disclosure is directed to a method of limiting volume of an audio signal received in a headphone. The method includes: (a) receiving and conducting the audio signal to a speaker through a series resistance including a channel of a junction field effect transistor (JFET); (b) rectifying a negative portion of the audio signal, and using the rectified signal portion to charge a capacitor; and (c) limiting the voltage of the audio signal, the limiting performed using a pair of anti-parallel diodes in series with a resistor. The processes (a), (b) and/or (c) are performed alone and/or together based on an input voltage of the audio signal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 10A is an exploded side view of a connector and PCB in accordance with an exemplary implementation of the disclosure;

FIG. 10B is a side view of the connector and PCB of FIG. 10A, with the connector shown as installed in the PCB in accordance with an exemplary implementation of the disclosure;

FIG. 10C is a top view of a headphone speaker in accordance with an exemplary implementation of the disclosure;

FIG. 10D is a frontal view of a connector and limiter circuit PCB installed in a speaker with an open cap in accordance with an exemplary implementation of the disclosure;

Corresponding reference numerals indicate corresponding parts throughout the several views of the drawings.

DETAILED DESCRIPTION

Example embodiments will now be described more fully with reference to the accompanying drawings.

Figure 1:
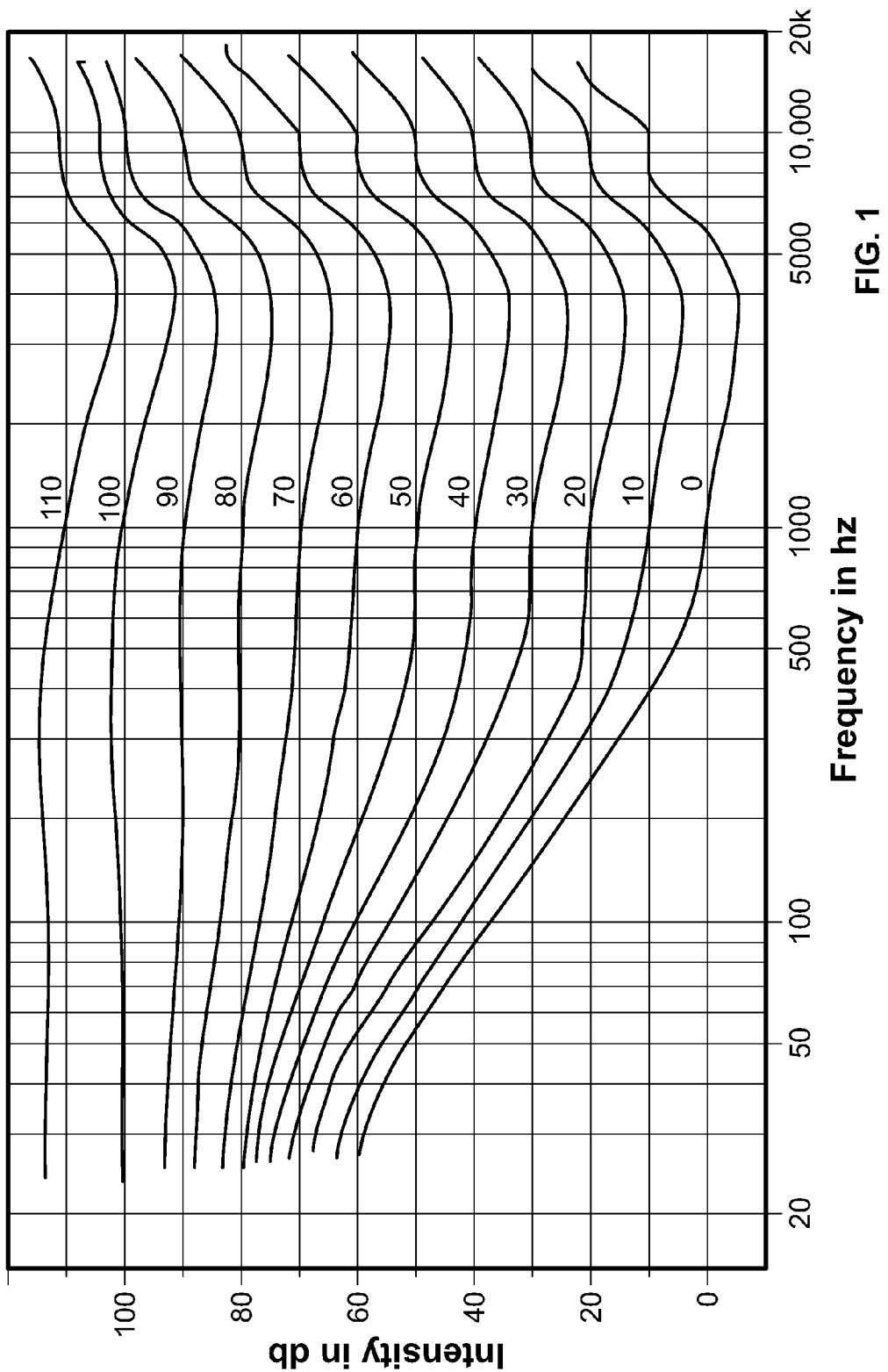
FIG. 1 is a graph showing Fletcher-Munson loudness curves.

The inventors have taken note of data published by Harvey Fletcher and Wilden Munson describing how the sensitivity of the human ear varies over the audible frequency range. Fletcher-Munson loudness curves, which are well known in the art, are shown in FIG. 1. The curves indicate that when people hear sound at low amplitude, they hear midrange and lower high frequencies best. Low frequencies however, need to be much higher in amplitude to be perceived as the same volume. People hear in a much more linear fashion the louder a sound becomes. Since the human hearing frequency response varies with amplitude, and musical information spans the entire audible frequency range, music sounds quite different at different amplitudes. Subsequently, people hear music best beyond 80 dB, which is where prolonged exposure begins to become an issue. Humans are essentially programmed to like music bud.

Limiter circuits may be provided in sound systems and devices to limit the volume of sound to a level that is safe for hearing. The inventors have noted that although various existing limiter circuits may limit the signal voltage and thus signal level very precisely, they do so without regard to sound quality. In a number of existing circuits, a pair of diodes is used to limit an input voltage to the diode turn-on voltage. When a silicon diode turns on, it does so very fast, and quickly clamps an incoming audio signal voltage to the diode threshold voltage, typically approximately 0.6 volts. The clamping action causes the loss of any musical information beyond the threshold and introduces a plurality of odd order harmonics, harmonics that are not necessarily related to the incoming musical content.

The result for the user can be fatiguing distortion that can ruin the listening experience. To get around this, the user would likely have to adjust a PMP's volume to a point where the diodes never turn on, and since this would vary from song to song, the volume would have to be constantly adjusted. One single peak exceeding the diode threshold voltage would typically detract from the song, like the annoying sound a CD makes when it skips.

Figure 2:
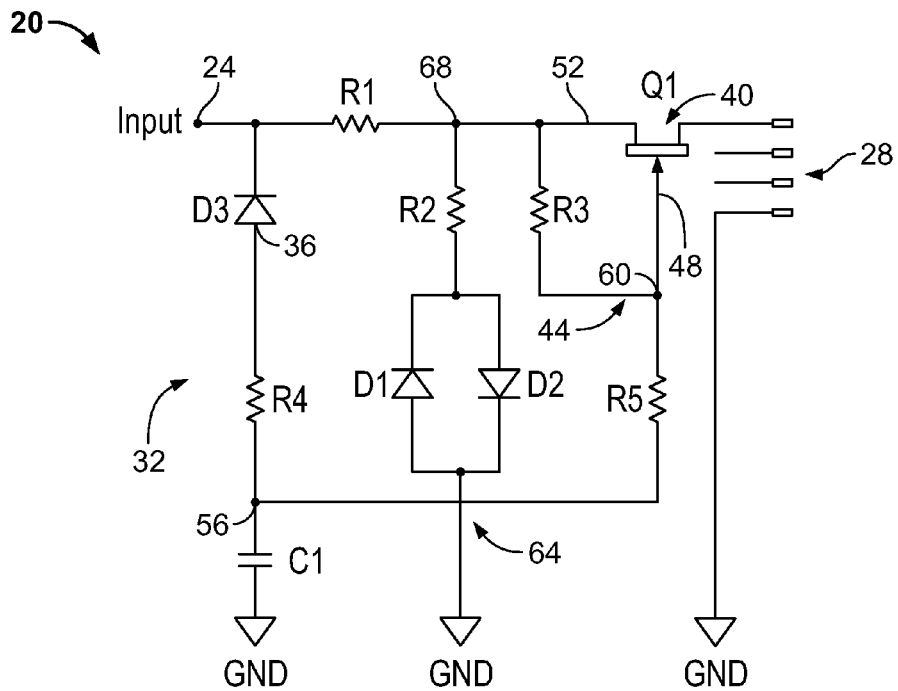
FIG. 2 is a circuit diagram of a limiter circuit configured in accordance with an exemplary implementation of the present disclosure.

Accordingly the inventors disclose herein various embodiments of limiter circuits and audio devices configured to provide safe yet satisfying listening. An example volume limiter circuit is indicated generally in FIG. 2 by reference number 20. The circuit 20 may be provided, e.g., in a set of headphones as further described below. It should be noted, however, that limiter circuit embodiments in accordance with aspects of the disclosure could be provided in relation to other types of devices, including but not limited to ear buds, headsets, etc. The limiter circuit 20 receives an audio signal at an audio source 24. The audio signal is received from a radio, a computer, a personal music player, etc., via wired and/or wireless connection and is transmitted to the limiter circuit 20.

The limiter circuit 20 is provided to limit the volume level of the audio signal at one or more speakers 28. The limiter circuit 20 includes a rectifier sub-circuit 32 configured to rectify at least a portion of the input signal. In the present embodiment the rectifier sub-circuit 32 includes a diode D3 configured to perform half-wave rectification, to rectify the negative portion of the audio signal. A resistor R4 is provided in series with the diode D3 on the p-terminal side 36 of the diode D3. The rectifier sub-circuit 32 is configured to provide a control voltage signal from a capacitor C1 as further described below.

A junction field effect transistor (JFET) Q1 of the limiter circuit 20 has a channel 40 connected in series between the audio source 24 and speaker(s) 28. A feedback sub-circuit 44 is configured to provide a gate signal at the gate 48 of the JFET Q1 and to modulate the control signal in accordance with the audio signal crossing the JFET channel 40. The feedback sub-circuit 44 includes a resistor R3 connected between the drain 52 and gate 48 of the JFET Q1. A second resistor R5 of the feedback sub-circuit 44 is connected between the resistor R3 and the rectifier sub-circuit 32. The feedback sub-circuit 44 is connected with the rectifier sub-circuit 32, e.g., at a node 56, so as to extend a range of variable resistance of the JFET channel 40. The resistors R3 and R5 are connected at a node 60 and have equal resistances in the present embodiment.

The limiter circuit 20 also includes a limiting sub-circuit 64 configured to limit the audio signal. The limiting sub-circuit 64 includes at least one pair of anti-parallel diodes D1 and D2 in series with a resistor R2. The diodes D1 and D2 are configured to perform a limiting function should the audio signal voltage become high enough to switch the diodes D1 and D2 on. R2 is configured to nullify harsh harmonics generated by the diodes D1 and D2. When the diodes D1 and D2 are switched on, a voltage is dropped across the resistor R2 relative to the current through the diodes D1 and D2. This voltage drop softens a clipping effect of the diodes D1 and D2 and tends to add primarily even order harmonics to the audio signal. Where the harmonics are octaves, they can be musically relevant and thicken the overall sound.

Because of the resistor R2, voltage across the limiting sub-circuit 64 continues to rise as current through the diodes D1 and D2 rises. In various embodiments of the disclosure, the configuration of the JFET Q1 makes it possible for the limiting sub-circuit 64 to complement the operation of the JFET Q1 in a novel way. A resistor R1 and the JFET channel 40 can be seen to form a series portion of a potential divider, with the speaker(s) 28 as a shunt portion. The JFET Q1 is configured as a variable resistor and sets a minimum value of attenuation. The diode D3 acts as a half-wave rectifier for the negative portion of the audio signal. This negative rectified signal charges the capacitor C1 to a negative value through the resistor R4. Charging of the capacitor C1 causes the gate 48 of the JFET Q1 to be pulled negative, thereby increasing the resistance across the channel 40 of the JFET Q1.

The feedback sub-circuit resistors R3 and R5 serve to extend a useful range of the JFET Q1 as a variable resistor. The resistors R3 and R5 form a potential divider to AC signals, since the resistor R5 is at AC ground (through the capacitor C1, which only stops DC). Thus the voltage of a signal that arrives at the node 60 is divided, e.g., in half. The signal from the node 60 reaches the gate 48 of the JFET Q1 and includes the control voltage signal from the capacitor C1. The control voltage thus is modulated in accordance with, e.g., in harmony with, the audio signal crossing the channel 40 of the JFET Q1, allowing the resistance of the JFET Q1 to stay linear over both positive and negative signal swings of the audio signal.

It should be noted that a single limiter circuit embodiment may function in different ways at different audio input voltage levels to limit the volume of an audio signal. Circuit functionality may change, e.g., as the audio signal's input voltage levels rise and fall. For example, when the audio signal input to the limiter circuit 20 is low, e.g., before reaching a voltage level at which the diodes D1, D2 and/or D3 are switched on, the limiter circuit 20 reduces voltage at the speaker(s) 28 through substantially only series resistance. The resistor R2 does not appear to be in the limiter circuit 20. Channel resistance through the JFET Q1 slightly increases, however, as the drain-to-source voltage across the JFET Q1 increases.

When the audio signal voltage has increased to a level at which the rectifier diode D3 is switched on, the rectified negative signal charges the capacitor C1, which increases the channel resistance of the JFET Q1. Voltage to the speaker(s)

28 decreases accordingly, reducing the volume of the audio signal. The control voltage to the JFET Q1 is signal-dependent, so the channel 40 resistance changes, e.g., with music. In various embodiments, (and while there are no safety guarantees,) only the loudest portions of the audio signal, and thus the portions hazardous to hearing, are likely to be affected.

As the audio signal increases in voltage, the diodes D1 and D2 start to become switched on and the limiting sub-circuit 64 begins to function. When the diodes D1 and D2 are fully switched on, the resistor R2 allows the voltage at a R1-R2 junction 68 to rise slightly above the threshold voltage of the diodes D1 and D2 (in the present embodiment, about 600 millivolts,) whereas the diode voltage would be clamped at the threshold value in the absence of the resistor R2.

As the audio signal voltage continues to increase, the capacitor C1 becomes increasingly negative, thereby increasing resistance across the JFET Q1. Voltage at the R1-R2 junction 68 may eventually reach a level at which it cannot be increased nearly as fast as the JFET channel voltage. Accordingly a very large increase in audio signal input voltage produces very little change in signal output voltage at the speaker (s) 28. Eventually a level may be reached where the gate 48 of the JFET Q1 has become so negative that the JFET Q1 is switched off, thereby muting the sound. An input voltage level would need to be extremely high for the sound to be muted, and such levels typically could be reached only by a "professional-grade" headphone amplifier.

Example values for components of the limiter circuit 20 are as follows:
R1, R2—162 R
R3, R5—1 MΩ
R4—5.49 kΩ
D1, D2, D3—1N4148W-V (Vishay® Semiconductor)
Q1—MMBF5484 (Fairchild Semiconductor®)

Figure 3:
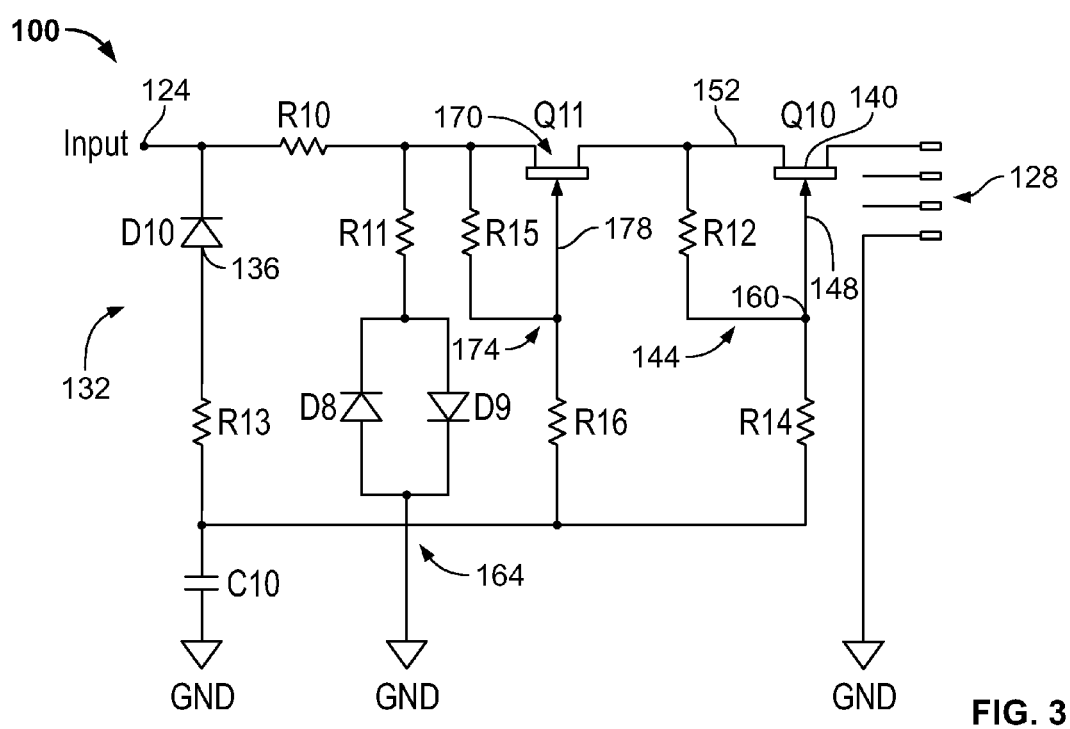
FIG. 3 is a circuit diagram of a limiter circuit configured in accordance with an exemplary implementation of the present disclosure.

In another example embodiment shown in FIG. 3, a limiter circuit 100 receives an audio signal at an audio source 124. The limiter circuit 100 is provided to limit the volume level of the audio signal at one or more speakers 128. The limiter circuit 100 includes a rectifier sub-circuit 132 configured to rectify at least a portion of the input signal. In the present embodiment the rectifier sub-circuit 132 includes a diode D10 configured to perform half-wave rectification, to rectify the negative portion of the audio signal. A resistor R13 is provided in series with the diode D10 on the p-terminal side 136 of the diode.

A junction field effect transistor (JFET) Q10 of the limiter circuit 100 has a channel 140 connected in series between the audio source 124 and speaker(s) 128. A feedback sub-circuit 144 is configured to provide a gate signal at the gate 148 of the JFET Q10 and to modulate a control signal from a capacitor C10 in accordance with the audio signal crossing the JFET channel 140. The feedback sub-circuit 144 includes a resistor R12 connected between the drain 152 and gate 148 of the JFET Q10. A second resistor R14 of the feedback sub-circuit 144 is connected between the resistor R12 and the rectifier sub-circuit 132. The feedback sub-circuit 144 is connected with the rectifier sub-circuit 132 so as to extend a range of variable resistance of the JFET channel 140 as previously described with reference to FIG. 1. The resistors R12 and R14 are connected at a node 160 and have equal resistances in the present embodiment.

The limiter circuit 100 also includes a limiting sub-circuit 164 configured to limit the audio signal. The limiting sub-circuit 164 includes at least one pair of anti-parallel diodes D8 and D9 in series with a resistor R11. The diodes D8 and D9 are configured to perform a limiting function should the audio signal voltage become high enough to switch them on.

The limiter circuit 100 includes a second JFET Q11 having a channel 170 connected in series between the audio source 124 and speaker(s) 128. A second feedback sub-circuit 174 is configured to provide a second gate signal at the gate 178 of the JFET Q11 and to modulate the control signal in accordance with the audio signal crossing the JFET channel 170. In some embodiments, the levels of resistance provided by the JFETS Q10 and Q11 may allow the limiting sub-circuit 164 to be omitted.

In some embodiments a limiter circuit may include a metal-oxide-semiconductor field-effect transistor (MOSFET) connected in parallel across the speaker(s). Additionally or alternatively, and referring to the limiter circuit 20 of FIG. 2, a small film capacitor from the bottom of the resistor R2 to ground could serve to further reduce any odd-order harmonics generated by the switching on of diodes D1 and D2. Additionally or alternatively, a very small resistance could be inserted from diodes D1 and/or D2 to ground to further reduce odd-order harmonics. High-frequency response might be changed where a portion or all of a limiter circuit is bypassed with a small film capacitor. Thus high frequencies might be limited very little or not at all, depending on the connection of such a capacitor. Additionally, a resistor could be added in series with such a bypass capacitor to limit an extent to which high frequencies might bypass the circuit.

Figure 4:
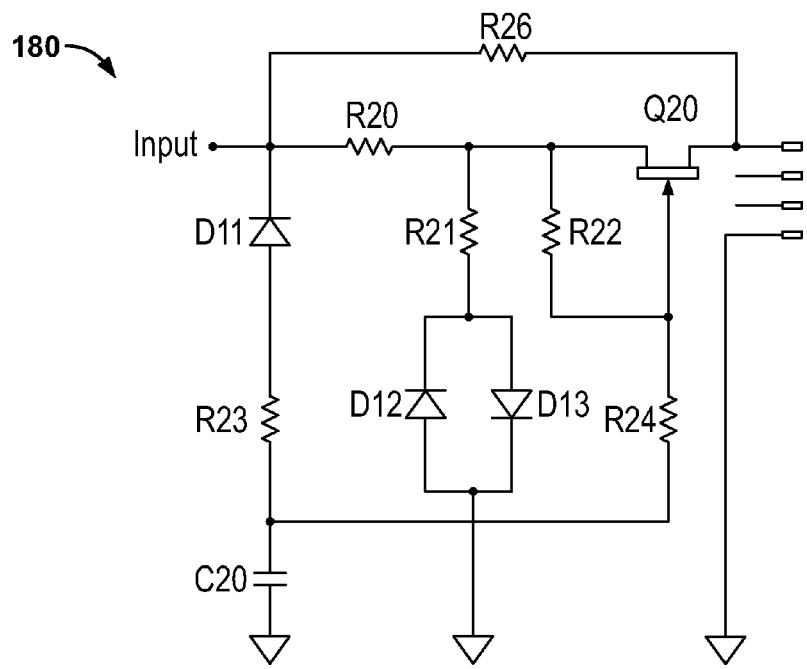
FIG. 4 is a circuit diagram of a limiter circuit configured in accordance with an exemplary implementation of the present disclosure.
Figure 5:
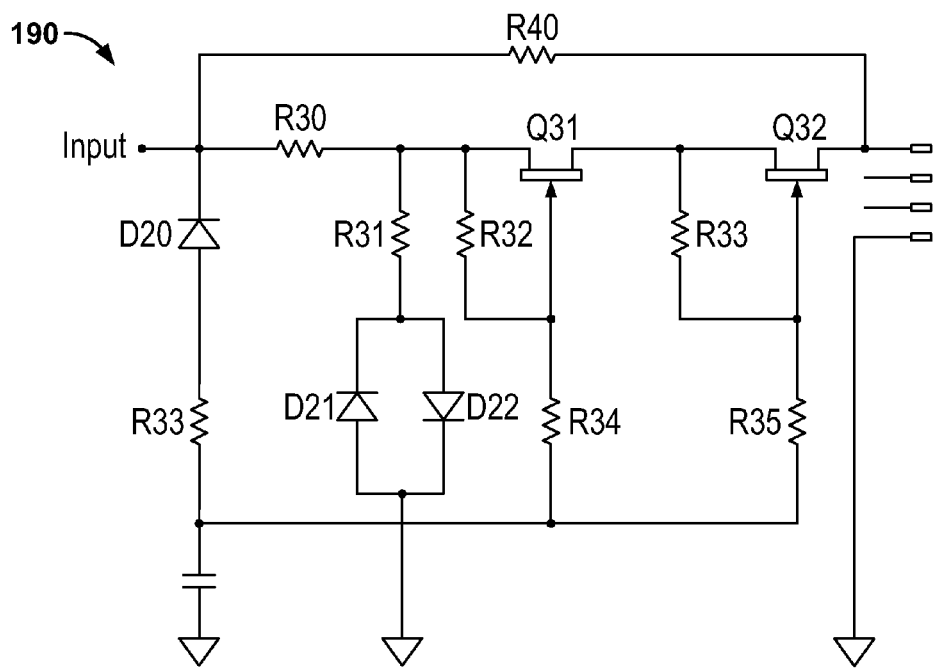
FIG. 5 is a circuit diagram of a limiter circuit configured in accordance with an exemplary implementation of the present disclosure.

In another example embodiment shown in FIG. 4, a limiter circuit 180 includes a resistance R26 between the input and speakers and in parallel with the rest of the circuit 180. Example values for components of the limiter circuit 180 are as follows:
R20—88.7 R
R21—169 R
R22, R24—1 MΩ
R23—5.49 kΩ
R26—10 kΩ
D11, D12, D13—1N4148W-V (Vishay® Semiconductor)
Q20—MMBF5484 (Fairchild Semiconductor®)
C20—1 uF In another example embodiment shown in FIG. 5, a limiter circuit 190 includes a resistance R40 between the input and speakers and in parallel with the rest of the circuit 190.

In various embodiments, various types of diodes, including but not limited to Schottky types, may be used, e.g., to provide various diode threshold voltages. Further, although n-channel devices are shown in FIGS. 2 through 5, it is possible that in some embodiments a p-channel device could be used. Other or additional forms of rectification also could be used, including full-wave rectification and rectification in which a positive portion of the audio signal is rectified. It also should be noted that although a JFET or other device may be referred to in the disclosure and claims as having a channel "connected in series" between two components, there may or may not be other or additional components connected to one or more nodes between the two components.

Figure 6:
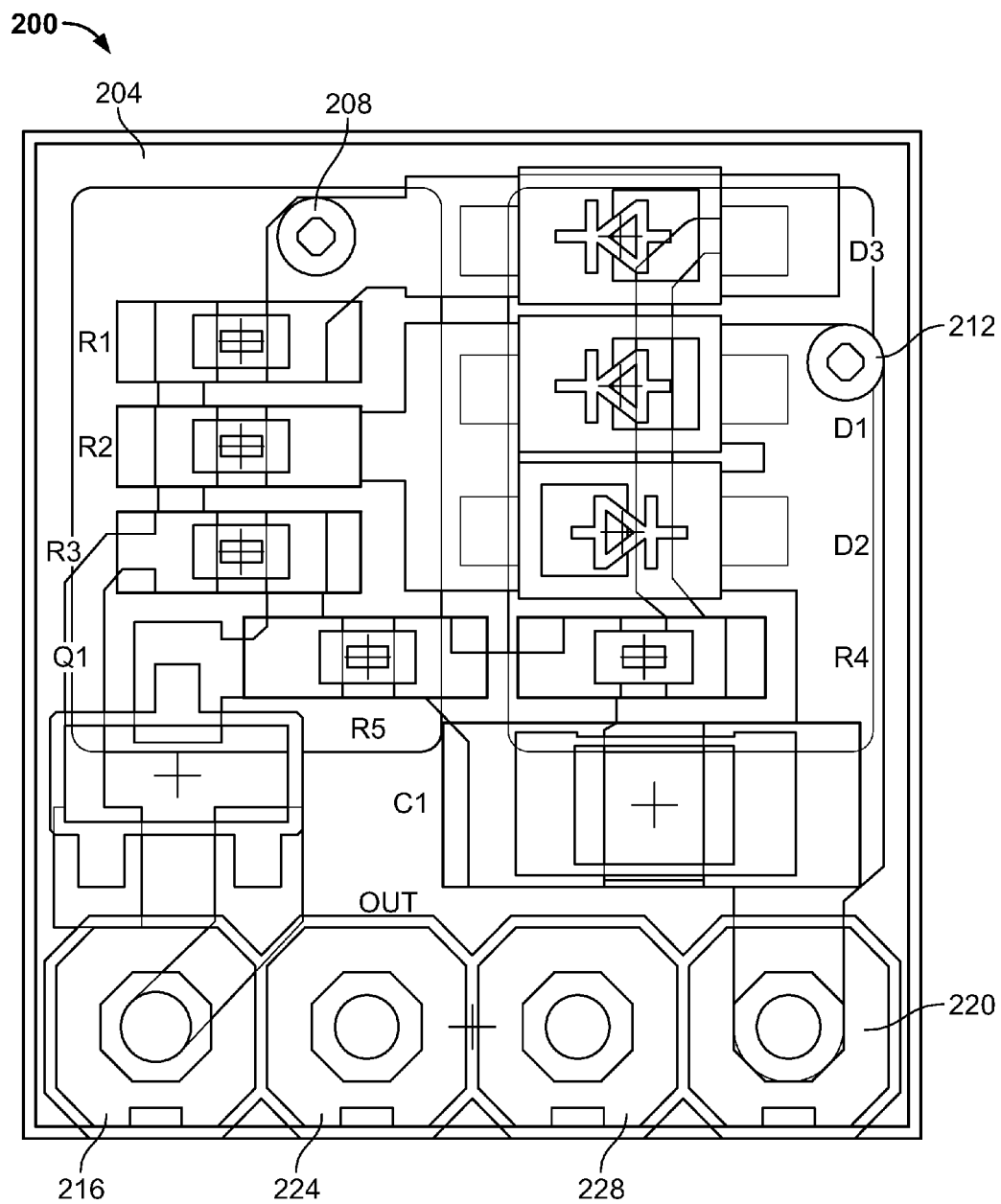
FIG. 6 is a diagram of a printed circuit board on which a limiter circuit is configured in accordance with an exemplary implementation of the present disclosure.

A limiter circuit may be arranged on a printed circuit board (PCB), e.g., as shown in FIG. 6. A limiter circuit 200 is provided on a PCB 204 that includes an audio signal input terminal 208, an input ground terminal 212, a speaker output terminal 216, and a speaker ground terminal 220. In the present embodiment, the limiter circuit 200 is configured to drive two speakers, e.g., in a pair of headphones. Accordingly, appropriate speaker and ground connections may be made to drive the second speaker through speaker and ground terminals 224 and 228. A bottom surface (not shown in FIG. 6) of the PCB 204 includes a pair of solder pads, one pad for providing an electrical connection through the audio signal input terminal 208 and the other pad for providing an electrical connection through the input ground terminal 212.

Figure 7:
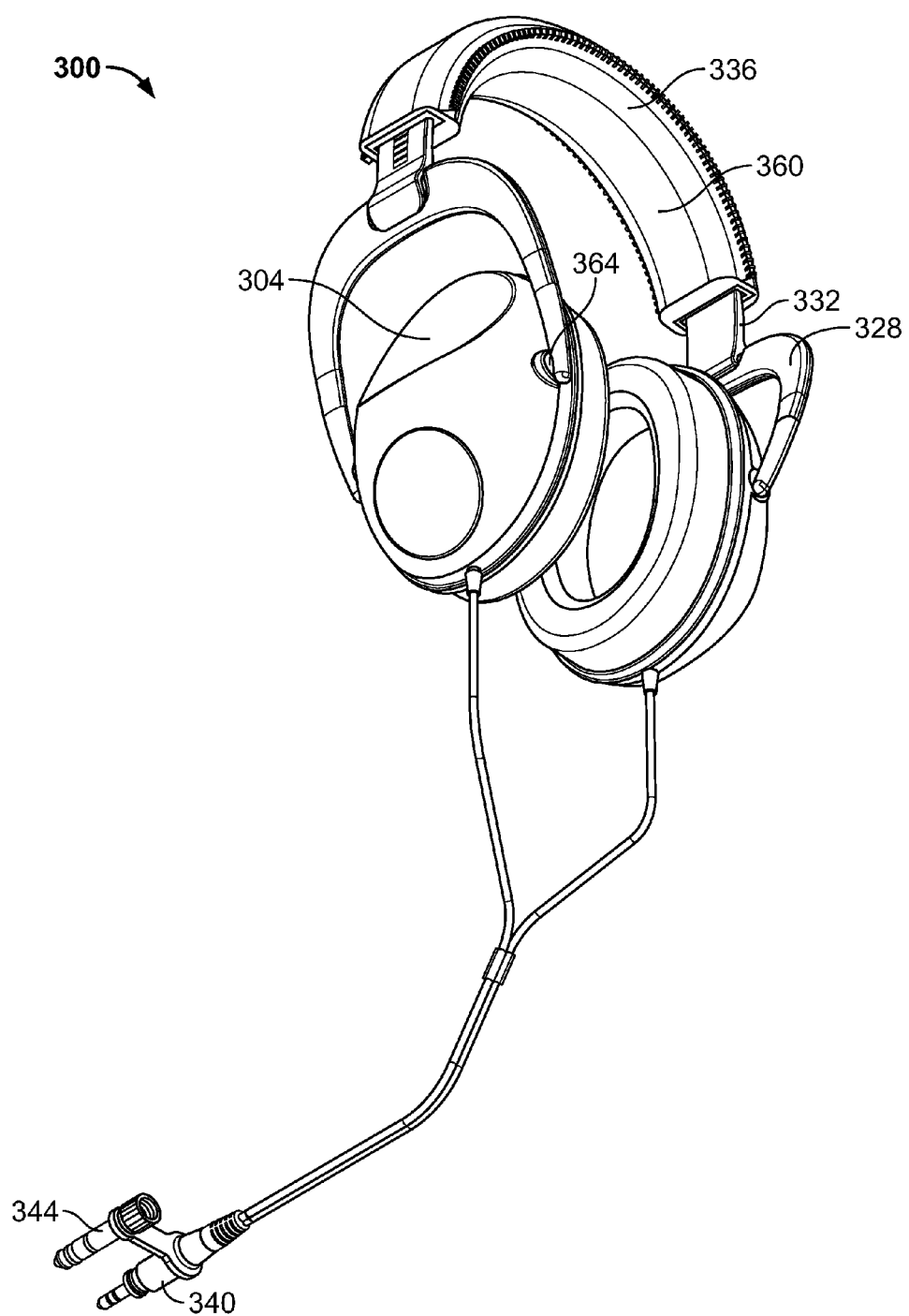
FIG. 7 is a perspective view of a headset in accordance with an exemplary implementation of the disclosure.
Figure 8:
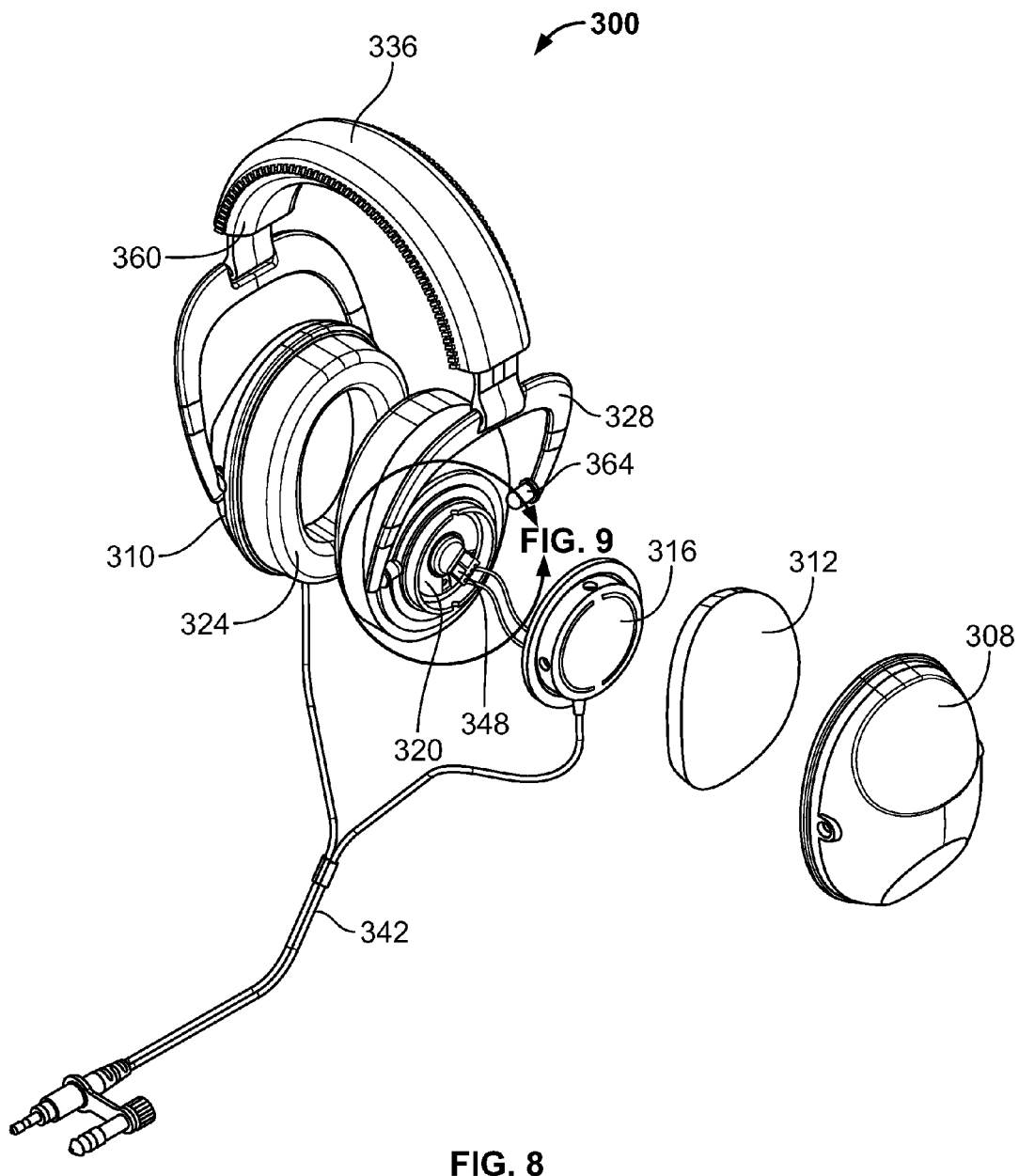
FIG. 8 is an exploded view of a headset in accordance with an exemplary implementation of the disclosure.
Figure 9:
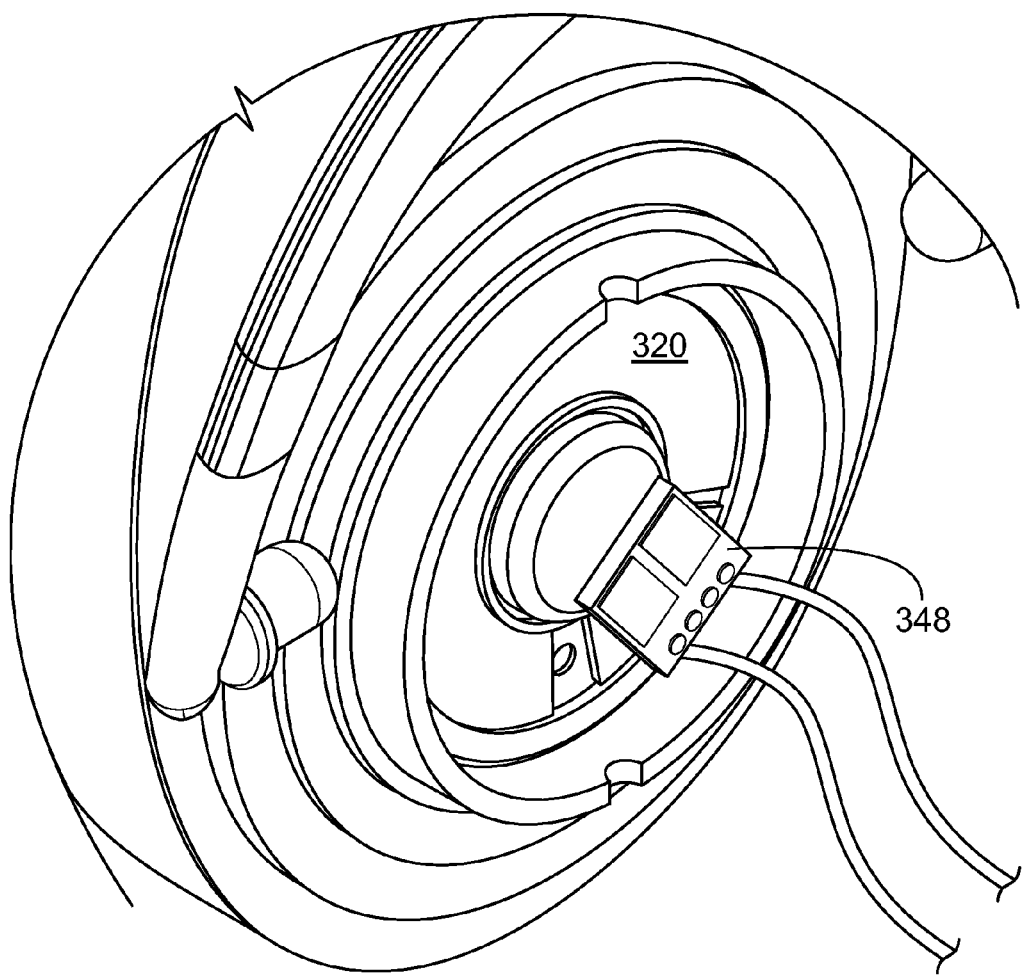
FIG. 9 is a view taken as indicated by arrows shown in FIG. 8.
Figure 10E:
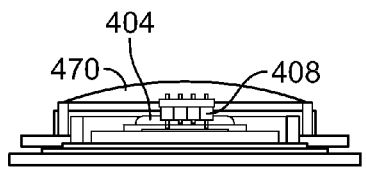
FIG. 10E is a frontal view of a connector and limiter circuit PCB installed in a speaker with an open cap in accordance with an exemplary implementation of the disclosure.
Figure 10F:
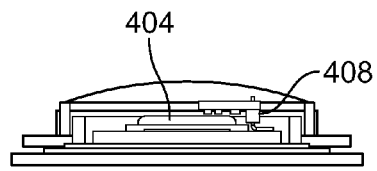
FIG. 10F is a side view of a connector and limiter circuit PCB installed in a speaker with a closed cap in accordance with an exemplary implementation of the disclosure.
Figure 10G:
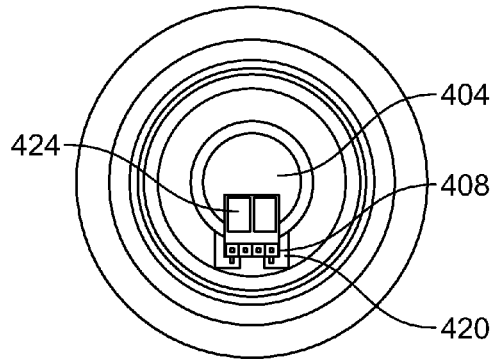
FIGS. 10G and 10H are top views of a connector and limiter circuit PCB installed in a speaker in accordance with an exemplary implementation of the disclosure.
Figure 10H:
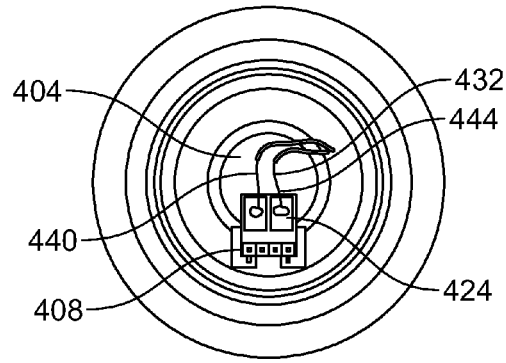

An example headphone set in which a volume limiter circuit is provided in accordance with aspects of the disclosure is indicated generally in FIGS. 7-9 by reference number 300. The headphone set 300 includes a pair of headphones 304 each having an ear cup 308, a flat plate 310, and sound-insulating foam 312 overlying a speaker cap 316. The cap 316 covers a speaker 320. Each headphone 304 also has an ear cushion 324. Each headphone 304 is pivotally mounted in a yoke 328 that is attached by a slider 332 to a padded headband 336. Lead wires 342 terminate in a plug 340 that may be inserted into a personal music player or other device to transmit an audio signal to the headphone speakers 320. In the present example embodiment, a screw-on adapter plug 344 also is provided so that a user may connect the headphones 304 to various audio devices. In the embodiment shown in FIGS. 7-9 a limiter circuit 348 is electrically connected between the speakers 320 and one of the lead wires 342 for carrying an audio signal from an audio device. The limiter circuit 348 is connected to the two speakers 320 by wiring that extends through the headband 336.

There are numerous ways in which a limiter circuit could be connected with one or more speakers in accordance with principles of the disclosure. For example, a limiter circuit could be provided inside a headband to which headphones are attached. Embodiments also are possible in which a limiter circuit is provided between a PMP (or other audio device) and a set of headphones. For example, a limiter circuit could be wired in-line with one or more leads connecting headphones to an audio device. Embodiments are also possible in which two limiter circuits may be provided, one for each speaker of a headphone set.

As shown in FIGS. 10A-10H, and referring to FIG. 6, the limiter circuit 200 may be installed relative to a headphone speaker 404 in the following manner. An elongate connector 408 may be provided that includes electrically conductive pins 412 corresponding to the PCB audio signal input terminal 208, input ground terminal 212, speaker output terminal 216 and speaker ground terminal 220. The connector 408 is installed on the PCB 204 by inserting the pins 412 through the PCB terminals (208, 212, 216, 220) and soldering the connector 408 on top of the PCB 204.

The PCB 204 and connector 408 are then installed in a headphone by soldering the appropriate pins 412 (in the present embodiment, the outermost pins corresponding to speaker output terminal 216 and ground terminal 220) to solder pads 420 of the speaker 404. The PCB 204 is installed so that the limiter circuit 200 components are facing the speaker 404, thereby exposing solder pads 424 on the bottom of the PCB 204. Lead wires 432 are then soldered to the PCB solder pads 424. Specifically, a ground wire 440 is soldered to the solder pad 424 for providing a ground connection, and an audio signal wire 444 is soldered to the solder pad 424 for providing an audio signal connection. In some embodiments the remaining two pins 412 (in the present embodiment, the middle two pins 412) may be used for speaker and ground connections to another speaker 404. A speaker cap 470 is then secured over the speaker 404 and the installed PCB 204.

In various aspects of the disclosure and referring to FIGS. 7-8, the headband 336, yokes 328, and ear cups 308 are configured to comfortably and durably accommodate wiring between the speakers 320 and the limiter circuit 348. Wiring may extend through a center sleeve (not shown) beneath a cushion 360 of the headband 336, and through or adjacent to sliders 332, yokes 328, and pivots 364 for connection to the speakers 320 as previously described. The center sleeve may be made, e.g., from a nylon resin such as Zytel® ST801 NC010A, available from DuPont™. The yokes 328 and sliders 332 may be made, e.g., from a polyacetal resin such as Jupital, available from Mitsubishi Engineering-Plastics Corporation. An anti-squeak additive such as Product Code Number G25-0782 by General Color & Chemical Company, Inc. may be added to the polyacetal resin. The ear cups 308 and flat plates 310 may be made, e.g., from acrylonitrile butadiene styrene (ABS) LG ABS HI121, available from LG Chem Ltd. Embodiments of headphone sets including limiter circuits can be configured to reduce ambient noise and increase user comfort. For example, in some embodiments, a limiter circuit may be provided in ambient noise isolation audio headphones, e.g., as described in U.S. Pat. No. 7,853,034, the disclosure of which is incorporated herein by reference in its entirety.

Embodiments of the foregoing limiting circuit and headset can be economically produced and can make it possible to limit volume to safe levels. Embodiments can be made using safe components and can provide a user with a great listening experience. In some configurations the circuit is set to a limit of approximately 85 dB, which is low enough to be safe for extended listening periods, yet loud enough to be satisfying. In embodiments in which the foregoing limiting circuit is used with passive isolation headphones, environmental noise is essentially no longer an issue, so that a volume limit, e.g., of 85 dB can be maintained in virtually any situation and still provide an outstanding listening experience. Embodiments of the foregoing volume limiting headphone can have a multitude of uses, e.g., by children and adolescents, musicians and travelers. The use of such headphones can constitute the first real step towards ear health and safety.

The above mentioned possible advantages are provided for purposes of illustration only, and do not limit the scope of the present disclosure. Exemplary embodiments of methods and systems disclosed herein may provide one or more of the above advantages, all of the above advantages, none of the above advantages, or combinations thereof.

Example embodiments are provided so that this disclosure will be thorough, and will fully convey the scope to those who are skilled in art. Numerous specific details are set forth such as examples of specific the components, devices, and methods, to provide a thorough understanding of embodiments of the present disclosure. It will be apparent to those skilled in the art that specific details need not be employed, that example embodiments may be embodied in many different forms (e.g., different materials may be used, etc.) and that neither should be construed to limit the scope of the disclosure. In some example embodiments, well-known processes, well-known device structures, and well-known technologies are not described in detail.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed herein could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A volume limiter circuit comprising:
a half-wave rectifier sub-circuit configured to rectify at least a portion of an audio signal received from an audio source and to provide a negative control signal;
a junction field effect transistor (JFET) having a channel connected in series between the audio source and a speaker; and
a feedback sub-circuit configured to provide a gate signal at a gate of the JFET and to modulate the control signal in accordance with the audio signal crossing the JFET channel;
the feedback sub-circuit connected with the half-wave rectifier sub-circuit so as to extend a range of variable resistance of the JFET channel.

2. The circuit of claim 1, further comprising a capacitor configured to be charged by the rectifier sub-circuit to a negative value to lower a voltage of the JFET gate.

3. The circuit of claim 1, further comprising a limiting sub-circuit configured to limit the audio signal, the limiting sub-circuit having at least one pair of anti-parallel diodes in series with a resistance.

4. The circuit of claim 3, configured to:
until the audio signal activates the rectifier sub-circuit, reduce voltage at the speaker using substantially only a series resistance;
when the rectifier sub-circuit has become activated, apply a negative voltage to the JFET gate through the feedback circuit; and
when the limiting sub-circuit has become activated, reduce voltage at the speaker through the limiting sub-circuit.

5. The circuit of claim 1, further comprising a second JFET having a channel connected in series between the audio source and the speaker; and
a second feedback sub-circuit configured to provide a second gate signal at a gate of the second JFET and to modulate the control signal in accordance with the audio signal crossing the second JFET channel.

6. The circuit of claim 1, wherein the feedback sub-circuit comprises a first resistance connected between the drain and gate of the JFET and a second resistance connected between the first resistance and the half-wave rectifier sub-circuit.

7. The circuit of claim 1, further configured to:
(a) receive and conduct the audio signal to the speaker through a series resistance including the JFET channel;
(b) rectify a negative portion of the audio signal, and using the rectified signal portion to charge a capacitor; and
(c) limit the voltage of the audio signal, the limiting performed using a pair of anti-parallel diodes in series with a resistor; and
perform (a), (b) and/or (c) alone and/or together based on an input voltage of the audio signal.

8. A headset comprising the circuit of claim 1.

* * * * *